United States Patent
Sakai et al.

(10) Patent No.: US 11,245,054 B2
(45) Date of Patent: *Feb. 8, 2022

(54) BASE SUBSTRATE, FUNCTIONAL ELEMENT, AND PRODUCTION METHOD FOR BASE SUBSTRATE

(71) Applicant: NGK INSULATORS, LTD., Nagoya (JP)

(72) Inventors: Masahiro Sakai, Nagoya (JP); Shohei Oue, Nagoya (JP); Masashi Goto, Nagoya (JP); Takashi Yoshino, Ama (JP)

(73) Assignee: NGK INSULATORS, LTD., Nagoya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/826,826

(22) Filed: Mar. 23, 2020

(65) Prior Publication Data

US 2020/0227589 A1 Jul. 16, 2020

Related U.S. Application Data

(63) Continuation of application No. PCT/JP2018/025154, filed on Jul. 3, 2018.

(30) Foreign Application Priority Data

Sep. 27, 2017 (JP) .............................. JP2017-186340

(51) Int. Cl.
H01L 33/18 (2010.01)
H01L 33/32 (2010.01)
(Continued)

(52) U.S. Cl.
CPC .............. *H01L 33/18* (2013.01); *C30B 29/38* (2013.01); *H01L 21/0242* (2013.01);
(Continued)

(58) Field of Classification Search
CPC ........... H01L 21/0242; H01L 21/02513; H01L 21/0262; H01L 33/18; H01L 33/32;
(Continued)

(56) References Cited

U.S. PATENT DOCUMENTS 6,113,685 A 9/2000 Wang et al.
6,627,520 B2 * 9/2003 Kozaki .................. C30B 25/02
257/E21.127

(Continued)

FOREIGN PATENT DOCUMENTS

JP 2000-091632 A 3/2000
JP 2003-007616 A 1/2003
(Continued)

OTHER PUBLICATIONS

Japanese language International Search Report for corresponding PCT/JP2018/025154, dated Sep. 11, 2018 (3 pages).
(Continued)

*Primary Examiner* — Savitri Mulpuri
(74) *Attorney, Agent, or Firm* — Flynn Thiel, P.C.

(57) ABSTRACT

A base substrate includes a supporting substrate and a base crystal layer provided on a main face of the supporting substrate composed of a crystal of a group 13 nitride and having a crystal growth surface. The base crystal layer includes a raised part. A reaction product of a material of the supporting substrate and the crystal of the group 13 nitride, metal of a group 13 element and/or void is present between the raised part and supporting substrate.

18 Claims, 9 Drawing Sheets

(51) Int. Cl.
*H01L 33/54* (2010.01)
*H01L 33/00* (2010.01)
*C30B 29/38* (2006.01)
*H01L 21/02* (2006.01)

(52) U.S. Cl.
CPC ...... *H01L 21/0254* (2013.01); *H01L 21/0262* (2013.01); *H01L 21/02513* (2013.01); *H01L 33/0075* (2013.01); *H01L 33/32* (2013.01); *H01L 33/54* (2013.01)

(58) Field of Classification Search
CPC . H01L 21/0254; H01L 33/54; H01L 33/0075; H01L 21/02458; H01L 21/02414; H01L 21/02389; C30B 29/38
See application file for complete search history.

(56) References Cited

U.S. PATENT DOCUMENTS

| | | |
|---|---|---|
| 2002/0137248 A1 | 9/2002 | Ogawa et al. |
| 2004/0147096 A1* | 7/2004 | Kitaoka ............ H01L 21/02458 438/483 |
| 2012/0018732 A1 | 1/2012 | Aida et al. |
| 2012/0156815 A1* | 6/2012 | Huang .................. H01L 33/20 438/33 |
| 2012/0319161 A1* | 12/2012 | Gotoda ............... H01L 33/0093 257/103 |
| 2014/0103362 A1 | 4/2014 | Kuraoka et al. |
| 2014/0103376 A1* | 4/2014 | Ou .......................... H01L 33/32 257/95 |
| 2014/0251519 A1* | 9/2014 | Piffard ................ B60C 11/0318 152/209.5 |
| 2018/0145213 A1* | 5/2018 | Jang ....................... H01L 33/20 |
| 2020/0227259 A1* | 7/2020 | Goto ................ H01L 21/02658 |

FOREIGN PATENT DOCUMENTS

| | | |
|---|---|---|
| JP | 2005-281067 A | 10/2005 |
| JP | 2011-073894 A | 4/2011 |
| JP | 2011-195377 A | 10/2011 |
| JP | 5359740 B2 | 12/2013 |
| JP | 2017-036174 A | 2/2017 |
| JP | 2017-036178 A | 2/2017 |
| JP | 6144630 B2 | 6/2017 |
| WO | 2010/082267 A1 | 7/2010 |
| WO | 2017/026196 A1 | 2/2017 |

OTHER PUBLICATIONS

Japanese language Written Opinion for corresponding PCT/JP2018/025154, dated Sep. 11, 2018 (4 pages).

* cited by examiner

BASE SUBSTRATE, FUNCTIONAL ELEMENT, AND PRODUCTION METHOD FOR BASE SUBSTRATE

CROSS-REFERENCE TO RELATED APPLICATIONS

This is a continuation of PCT/JP2018/025154, filed Jul. 3, 2018, which claims priority to Japanese Application No. 2017-186340, filed Sep. 27, 2017, the entire contents of which are hereby incorporated by reference.

BACKGROUND ARTS

Light-emitting devices such as light emitting diodes (LEDs) that use sapphire (α-alumina single crystal) as a monocrystalline substrate, with various types of gallium nitride (GaN) layers formed thereon are known. For example, light-emitting devices have been mass-produced having a structure in which an n-type GaN layer, a multiple quantum well (MQW) layer with an InGaN quantum well layer and a GaN barrier layer laminated alternately therein and a p-type GaN layer are formed in a laminated manner in this order on a sapphire substrate.

It has been proposed, in a base substrate (template substrate) for growing a layer of a crystal of a group 13 nitride such as gallium nitride, to provide an irregularity on a crystal growth surface of a base crystal layer of the base substrate. That is, according to patent documents 1 to 3, it has been disclosed the procedure of forming the irregularity on the crystal growth surface of the base substrate to reduce dislocations and stress in a crystal.

According to patent document 2, the growth surface of the base crystal layer is made a flat c-plane and an inclined surface inclined with respect to a c-plane and without including a plane parallel with the c-plane is made continuous to form the irregularity.

According to patent document 3, on the crystal growth surface of the base substrate, a flat part of +c-plane and a flat and inclined surface to which non-+c-plane is exposed is formed. According to patent document 3, rectangular projections and recesses are formed on the crystal growth surface of the base substrate.

Further, according to patent document 4, in the case that a seed crystal film is formed on a sapphire substrate, it is proposed that voids are formed along an interface of the sapphire substrate by heating or a laser and seed crystal film and that the void ratio is made 12.5% or lower. Cracks or fractures of a gallium nitride crystal layer are thereby suppressed.

PATENT DOCUMENTS (Patent document 1) Japanese Patent No. 5359740B
(Patent document 2) Japanese Patent Publication No. 2017-036174A
(Patent document 3) Japanese Patent Publication No. 2005-281067A
(Patent document 4) Japanese Patent No. 6144630B

SUMMARY OF THE INVENTION

Although a crystal of a group 13 nitride is easily associated in the direction of an a-axis, the association in the direction of a m-axis is difficult. Thus, according to the base substrates of patent documents 1 to 3, when the crystal of the group 13 nitride is grown into a thin film, the disassociation of the crystals may occur or the sufficient reduction of pits may be difficult so that the reduction of the dislocation density is limited in regions where the crystal is grown in the direction of an axis other than the c-axis and a-axis. Thus, when an LED is produced on the disassociation parts or pits of the substrate, it is proved that a leak may occur to reduce the production yield.

An object of the present invention is, in a base substrate for growing a crystal of a group 13 nitride on a crystal growth surface of a base crystal layer, to provide a structure capable of further reducing a dislocation density of the layer of the crystal of the group 13 nitride.

The present invention provides a base substrate comprising:
  a supporting substrate; and
  a base crystal layer provided on a main face of the supporting substrate, comprising a crystal of a nitride of a group 13 element and having a crystal growth surface,
  wherein the base crystal layer comprises a raised part; and
  wherein a reaction product of a material of the supporting substrate and the crystal of the nitride of the group 13 element, a metal of a group 13 element and/or a void is present between the raised part and the supporting substrate.

The present invention further provides a base substrate comprising:
  a supporting substrate; and
  a base crystal layer provided on a main face of the supporting substrate, comprising a crystal of a nitride of a group 13 element and having a crystal growth surface,
  wherein the base crystal layer comprises a raised part;
  wherein the crystal growth surface forms a curved line; and
  wherein a height of the crystal growth surface on the curved line with respect to the main face is smoothly changed, provided that the raised part is viewed along a cross section perpendicular to the main face of the supporting substrate.

The present invention further provides a functional device comprising:
  the base substrate; and
  a functional layer provided on the base crystal layer.

According to the present invention, the structure that the base crystal layer includes the raised part and that the reaction product of the material of the supporting substrate and crystal of the nitride of the group 13 element, the metal of the group 13 element and/or the void is present between the raised part and the supporting substrate is provided. According to this structure, the association of the layer of the crystal of the group 13 nitride is facilitated over the crystal growth surface, so that pits generated by the disassociation are reduced and the dislocation density of the layer of the crystal of the group 13 nitride is reduced.

Further, the structure is provided that the raised part is provided in the base crystal layer, that the crystal growth surface forms a curved line and that a height of the crystal growth surface on the curved line with respect to the main face is smoothly changed, provided that the raised part is viewed along the cross section perpendicular to the main face of the supporting substrate. According to this structure, the association of the layer of the crystal of the group 13 nitride is facilitated over the crystal growth surface, so that pits generated by the disassociation are reduced and the dislocation density of the layer of the crystal of the group 13 nitride is reduced.

EMBODIMENTS FOR CARRYING OUT THE INVENTION

Figure 1A:
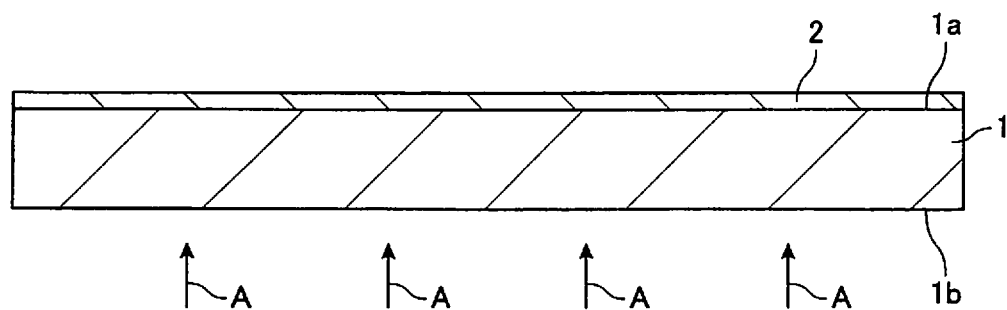
FIG. 1(a) shows the state that a base crystal layer 2 is provided on a supporting substrate 1.

The present invention will be described further in detail, appropriately referring to the drawings.

As shown in FIG. 1(a), a base crystal layer 2 is film-formed on a main face 1a of a supporting substrate 1. 1b represents a bottom face of the supporting substrate 1. Laser light is then irradiated as arrows A from the side of the bottom surface 1b of the supporting substrate 1. The laser light passes through the supporting substrate 1 and reaches an interface between the base crystal layer 2 and supporting substrate 1.

Figure 1B:
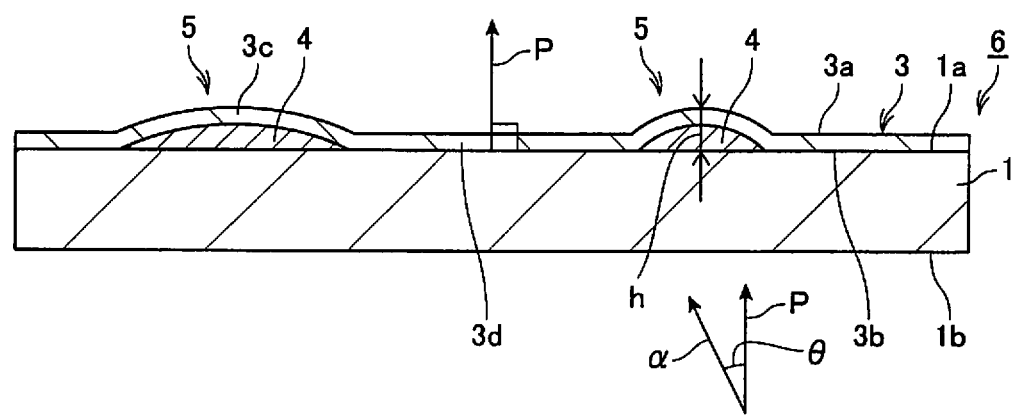
FIG. 1(b) shows the state that a raised part 5 is provided on a base crystal layer 3.

Here, the energy of the laser light is adjusted so that a reaction product 4 of materials of the supporting substrate and base crystal layer is generated between the supporting substrate and base crystal layer, as shown in FIG. 1(b). According to the present example, the reaction product 4 contacts the main face 1a of the supporting substrate 1 and an interface 3b of the base crystal layer 3. As a result, a curved part 3c of the base crystal layer 3 is curved and raised on the upper side of the raised part 4. On the other hand, the base crystal layer 3 contacts the main face 1a of the supporting substrate at locations where the reaction product 4 is not generated. 3a represents a crystal growth surface and 6 represents a base substrate.

Further, a metal of a group 13 element may be generated instead of the reaction product, or both the reaction product and the metal of the group 13 element may be generated.

Figure 2A:
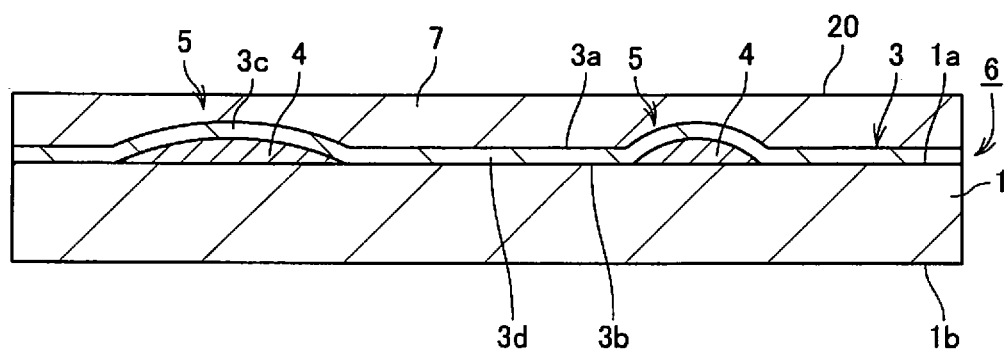
FIG. 2(a) shows the state that a thin layer 7 of a crystal of a group 13 nitride is provided on the base crystal layer 3, and FIG. 2(b) show the state that a thick film of a layer 8 of a crystal of a group 13 nitride is provided on the base crystal layer 3.

Then, as shown in FIG. 2(a), a crystal (thin film) 7 of a nitride of a group 13 element may be grown on the crystal growth surface 3a of the base crystal layer 3. 20 represent a growth surface of a functional device.

Alternatively, as shown in FIG. 2 b), a crystal 8 (thin film) of a crystal of a group 13 nitride may be grown on the growth surface 3a of the base crystal layer 3. 20 represent the growth surface of the functional device. At this stage, the crystal 8 of the group 13 nitride may be used as a template substrate without separating it from the supporting substrate 1. However, the crystal 8 of the group 13 nitride may be separated from the supporting substrate to provide a self-standing substrate, which may be used as a template substrate.

A functional device structure is then formed on the crystal 7 or 8 of the group 13 nitride. Although the kind of the functional device structure is not particularly limited, a light-emitting device may be listed. Further, a plurality of the functional layers may be formed on the crystal.

Preferably, as shown in FIG. 1(b), the curved part 3c of the crystal growth surface 3 forms a curved line, and the height h of the crystal growth surface 1a on the curved line with respect to the main face 1a is smoothly changed, provided that the raised part is viewed along a cross section (cross section shown in FIG. 1(b)) perpendicular to the main face 1a of the supporting substrate. The height h is a height with respect to the main face of the supporting substrate in a direction the normal line P. According to this structure, the association of the layer of the crystal of the group 13 nitride is facilitated on the crystal growth surface, so that pits generated by the disassociation are reduced and the dislocation density of the layer of the crystal of the group 13 nitride is reduced when the layer 7 or 8 of the crystal of the group 13 nitride is film-formed on the crystal growth surface.

Constituents of the present invention will be further described below.

According to the inventive production method, a base crystal layer composed of a group 13 nitride is provided on a supporting substrate.

Here, as a material forming the supporting substrate, a material is selected having a bandgap larger than a bandgap of the group 13 nitride formed on the base crystal layer. When the material of the group 13 nitride formed on the base crystal layer is gallium nitride, as its bandgap is about 3.4 eV, the material of the supporting substrate includes sapphire, crystalline orientated aluminum, gallium oxide, and $Al_xGa_{1-x}N$ ($0<x\leq1$). Preferably, the material of the supporting substrate has a composition of $Al_2O_3$.

The bottom face of the supporting substrate opposite to the base crystal layer may be a mirror surface or a roughened surface and preferably be the roughened surface. By this, after the laser light incident into the supporting substrate is scattered at the bottom surface of the supporting substrate, the laser light is irradiated onto the base crystal layer at the interface, so that the effects of the beam profile of the laser light is suppressed. When the bottom face of the supporting substrate opposite to the base crystal layer is the roughened surface, the arithmetic surface roughness Ra of the roughened surface may preferably be 0.1 to 2 µm.

When the bottom face of the supporting substrate is the mirror face, it is easy to form the raised part pattern using spots of the laser light. Alternatively, a protective layer, which does not transmit the laser light, may be formed on the bottom face of the supporting substrate and then patterned to control the pattern of the raised part on the surface.

From the viewpoint of preventing cracks in the supporting substrate directly after the cooling, the thickness of the supporting substrate may preferably be 0.5 mm or larger and more preferably be 1 mm or larger. Further, from the viewpoint of handling, the thickness of the supporting substrate may preferably be 3 mm or smaller.

A base crystal layer composed of a group 13 nitride is then provided on the supporting substrate.

When the base crystal layer is formed, preferably, a buffer layer is provided on the supporting substrate and the base crystal layer is then grown thereon.

The method of forming this buffer layer may preferably be a vapor phase processes including metal organic chemical vapor deposition (MOCVD), hydride vapor epitaxy (HVPE), molecular beam epitaxy (MBE) and sublimation.

The base crystal layer may be a single layer or may include the buffer layer on the side of the supporting substrate. The method of forming the base crystal layer may be vapor phase processes as one preferred example, including metal organic chemical vapor deposition (MOCVD), hydride vapor epitaxy (HVPE), pulsed excitation deposition (PXD), molecular beam epitaxy (MBE) and sublimation. Metal organic chemical vapor deposition is particularly preferred.

Further, in the group 13 nitride forming the base crystal layer, the group 13 element means a group 13 element in the Periodic Table defined by IUPAC. The group 13 element is specifically gallium, aluminum, indium, thallium or the like.

From the viewpoint of preventing melt-back or disappearance during the crystal growth, the thickness of the base crystal layer may preferably be 0.5 μm or larger and more preferably be 2 μm or larger. Further, from the viewpoint of productivity, the thickness of the base crystal layer may preferably be 15 μm or smaller.

Then, the laser light is irradiated from the side of the supporting substrate, the reaction product of the material of the supporting substrate and crystal of the group 13 nitride, metal of the group 13 element and/or void is generated between the base crystal layer and supporting substrate, so that the base crystal layer is raised. It is thereby possible to provide the raised part above the reaction product, metal of the group 13 element and/or void.

In this case, by the laser irradiation, the layer of the crystal of the group 13 nitride AN (A represents one or more element (s) selected from the group 13 elements such as Ga, In, Ta, Al or the like) is decomposed into A and N, and A is then diffused into the supporting substrate to generate the reaction product 4. The reaction product 4 has a composition containing at least A and an element forming the supporting substrate. Then, the reaction product may be an alloy of A and the element forming the supporting substrate, or a composition of the element forming the supporting substrate and oxygen. The element forming the supporting substrate may preferably be aluminum.

According to a preferred embodiment, the composition of the reaction product is as follows as a whole of the reaction product.

A (A represents a single group 13 element other than Al, or a plurality of group 13 elements including Al):0.1 to 99.5 mol % (preferably 0.1 to 40 mol %, particularly preferably 0.5 to 40 mol %)

Al: 0.5 to 99 mol % (preferably 29 to 54 mol %, particularly preferably 29 to 50.5 mol %)

O: 0 to 50 mol % (Preferably 31 to 50 mol %, particularly preferably 31 to 49 mol %)

When the supporting substrate is aluminum oxide and A is Al, the composition of the reaction product is as follows as a whole of the reaction product.

Al: 50 to 100 mol % (Preferably 50 to 72 mol %, particularly preferably 51 to 69 mol %)

O: 0 to 50 mol % (Preferably 28 to 50 mol %, particularly preferably 31 to 49 mol %)

However, it is not necessary that reaction product as a whole have a uniform composition distribution, and the composition of the reaction product may have inclined compositions. For example, on the side of the supporting substrate of the reaction product, the molar ratios of aluminum and oxygen may be relatively higher and the molar ratio of the group 13 element may be relatively lower. On the other hand, on the side of the base crystal layer of the reaction product, the molar ratios of aluminum and oxygen may be relatively lower and the molar ratio of the group 13 element may be relatively higher.

Further, according to an embodiment, the reaction product A, reaction product B or the metal of the group 13 element A (A represents a group 13 element other than Al) may be generated on the side of the crystal of the group 13 element.

(Reaction Product A)
  A: 87 to 97.5 mol %
  Al: 0.5 to 3 mol %
  O: 2 to 10 mol %
(Reaction Product B)
  A: 95 to 99.5 mol %
  Al: 0.5 to 5 mol %

Further, according to an embodiment, first, second and third layers are generated from the layer of the crystal of the group 13 element to the supporting substrate as follows.

First layer: Reaction product A, reaction product B or metal of a group 13 element A (A represents a group 13 element other than Al)
  Second Layer:
  A: 0.5 to 40 mol %
  Al: 29 to 50.5 mol %
  O: 31 to 49 mol %
  Third Layer:
  A: 0.1 to 0.4 mol %
  Al: 50 to 54 mol %
  O: 45 to 50 mol %

Then, the method of analyzing the compositions of the reaction products is as follows.

Measurement System:

A element analyzing system ("JED-2300T" supplied by JEOL Ltd.) is used to perform the elemental analysis.

Measurement Conditions:

A sample is thinned by a FIB (focused ion beam) method and subjected to analysis at an acceleration voltage or 200 kV, an X-ray extraction angle of 21.9°, a solid angle of 0.98 s r and a capture time of 30 seconds.

The thickness of the reaction product or metal of the group 13 element is not particularly limited. From the viewpoint of suppressing the warping or cracking of the layer of the crystal of the group 13 nitride, the thickness of the reaction product or metal of the group 13 element may preferably be 1 nm or larger. Further, from the viewpoint of generating the raised part, the thickness of the reaction product or metal of the group 13 element may preferably be 10 nm or larger and more preferably be 100 nm or larger. Further, from the viewpoint of reducing the dislocation density of the layer of the crystal of the group 13 nitride, the thickness of the reaction product or metal of the group 13 element may preferably be 500 nm or smaller and more preferably be 400 nm or smaller.

Here, the energy of the laser light irradiated from the side of the supporting substrate is adjusted so that the reaction product or metal of the group 13 element can be generated on the main face of the supporting substrate. And the reaction product and metal of the group 13 element can be generated under the raised part at the same time or only the void can be generated under the raised part.

Figure 3A:
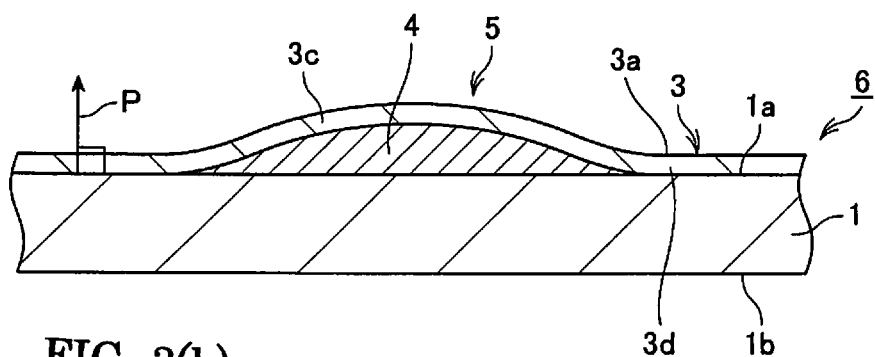
FIGS. 3(a), 3(b) and 3(c) show the state that raised parts 5, 5A and 5B are provided on the base crystal layer 3, respectively.
Figure 3B:
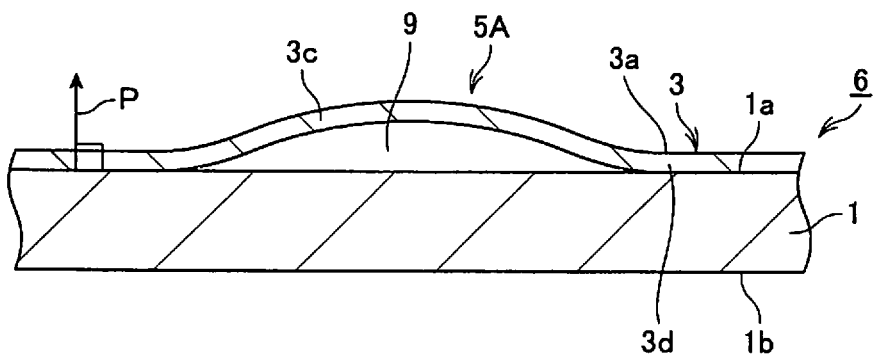

For example, according to an example of FIG. 3(a), the reaction product 4 is generated under the raised part 5 and the base crystal layer is raised by the reaction product 4. On the other hand, according to an example of FIG. 3(b), a void 9 is generated between the supporting substrate 1 and base crystal layer 3 and the base crystal layer 3 is raised by the void 9 to form a raised part 5A.

Figure 3C:
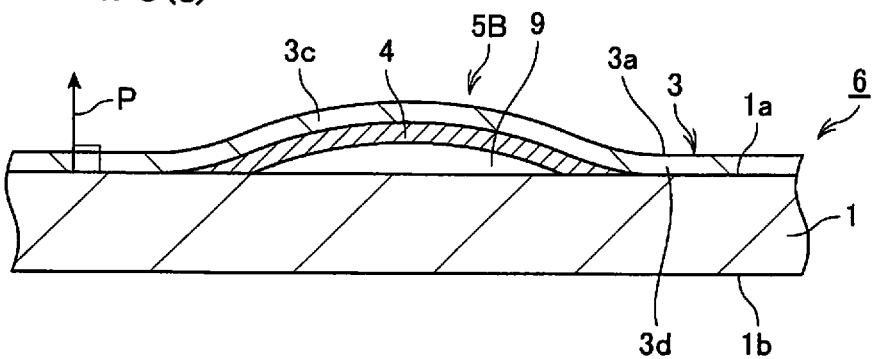
Figure 4A:
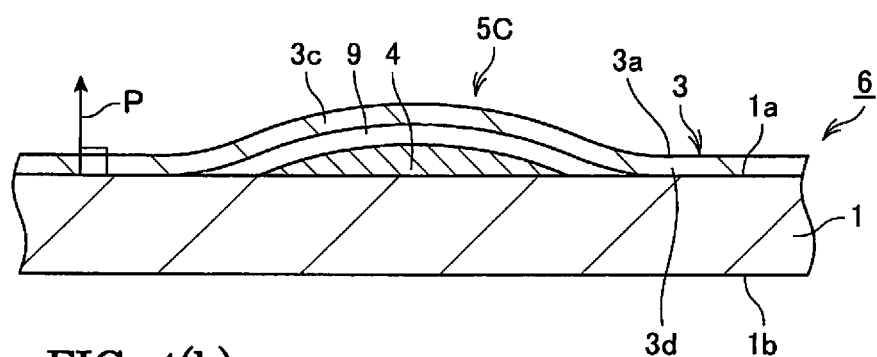
FIGS. 4(a), 4(b) and 4(c) show the state that raised parts 5C, 5D and 5E are provided on the base crystal layer 3, respectively.

Further, according to an example of FIG. 3(c), the void 9 and reaction product 4 are generated between the supporting substrate 1 and base crystal layer 3 and the base crystal layer 3 is raised by the void 9 and reaction product 4 to form a raised part 5B. Further, according to an example of FIG. 4(a), the void 9 is generated between the supporting substrate 1 and base crystal layer 3 and the base crystal layer 3 is raised by the void 9 to form a raised part 5C. According to the present example, the void 9 is present over the reaction product 4.

Figure 4B:
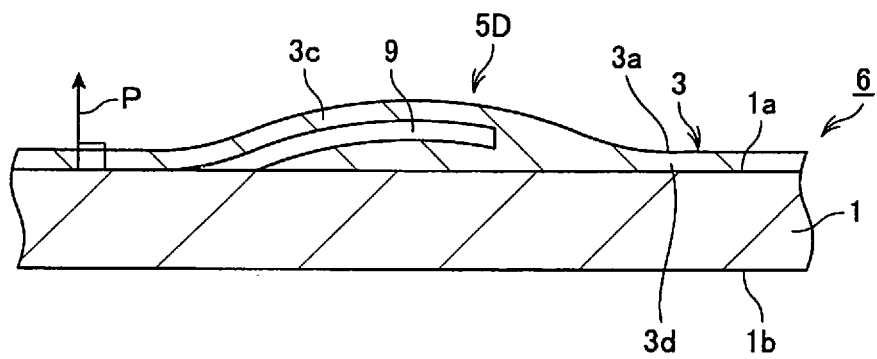
Figure 4C:
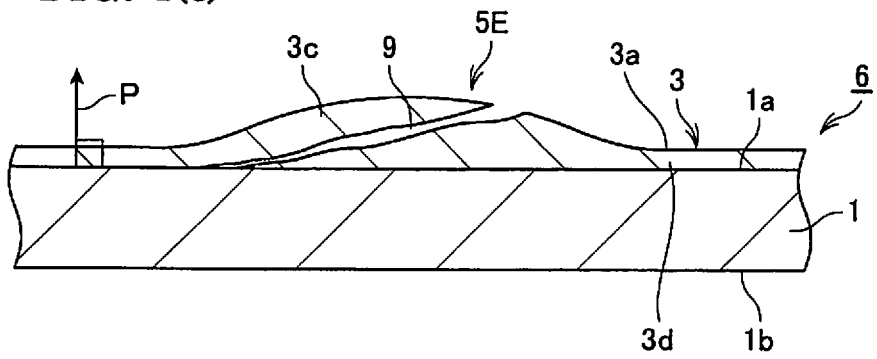

Further, the void may provide cracks inside of the base crystal layer 3 and the void may reach the surface of the raised part of the base crystal layer 3 to form a recess. For example, according to an example of FIG. 4(b), the elongate void 9 is extended inside of a raised part 5D to form a kind of a crack. Further, according to an example of FIG. 4(c), the void 9 is generated under the raised part 5E and the tip end of the void 9 reaches to the surface of the raised part 5E to form a recess.

Figure 5A:
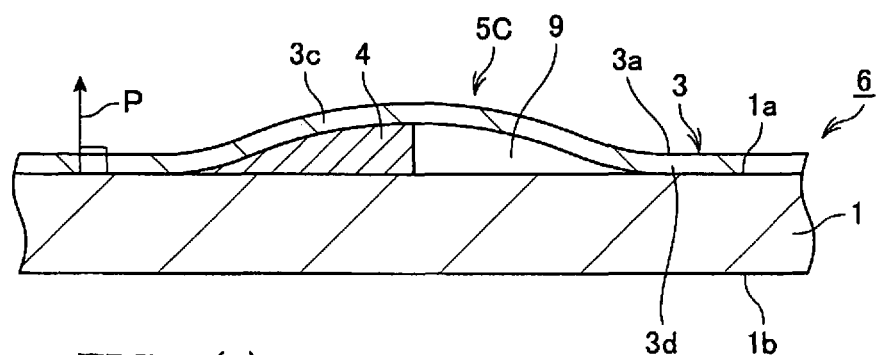
FIG. 5(a) shows the state that the raised part 5C is provided on the base crystal layer 3, FIG. 5(b) show the state that the raised part 5 and a flat part 3d are provided on the base crystal layer 3.

Further, according to an example of FIG. 5(a), the void 9 and reaction product 4 are generated between the supporting substrate 1 and base crystal layer 3 and the base crystal layer 3 is raised by the void 9 and reaction product 4 to form a raised part 5C. However, the reaction product 4 is positioned in an inside half of the raised part and the void 9 is positioned in a half on the opposite side of the reaction product in the raised part.

For example, as illustrated referring to FIG. 1(b), the curved part of the crystal growth surface 3 forms a curved line and a height h of the crystal growth surface 3a on the curved line with respect to the main face 1a is smoothly changed, provided that the raised part 5 is viewed along a cross section perpendicular to the main face 1a of the supporting substrate 1. As the height h of the curved part 3c of the crystal growth surface 3 on the raised part surface is differentiated to obtain an inclined angle of the crystal growth surface 3a. Thus, the height of the crystal growth surface 3 is smoothly changed, indicating that the inclined angle of the crystal growth surface 3a is continuously changed without a cornered part at which the inclined angle is discontinuously changed. It is, however, permitted that a recess or crack is present locally.

Then, although the cross-sectional shape of the profile of the crystal growth surface of the raised part is not specifically limited, various shapes such as a circle arc, ellipse arc, hyperbola, parabola, race track or the like may be listed.

The dimension of each raised part is not particularly limited. However, from the viewpoint of reducing the dislocation density of the layer of the crystal of the group 13 nitride, the area of the raised part viewed in a plan view may preferably be 1 $\mu m^2$ to 0.8 $mm^2$. Further, the maximum value of the height h of the raised part with respect to the main face may preferably be 10 to 1000 nm and more preferably be 100 to 700 nm, from the viewpoint of the productivity.

Further, the ratio of the area of the raised part in the whole area of the crystal growth surface of the base crystal layer may preferably be 5 to 80% from the viewpoint of the present invention and, more preferably, be 15 to 60% from the viewpoint of productivity.

The dimension of the raised part was measured using ZYGO (Three-dimensional optical profiler "New View 7300" supplied by Canon corporation) at the measurement condition of 5-fold in a visual field of 1.4 mm and 1 mm to measure the heights of the raised parts to be observed and the arithmetic average of the heights is taken as an average height of the raised parts. Further, the ratio of the raised part is calculated by performing binary processing using an image analysis software "WinROOF" (supplied by MITANI CORPORATION).

Figure 5B:
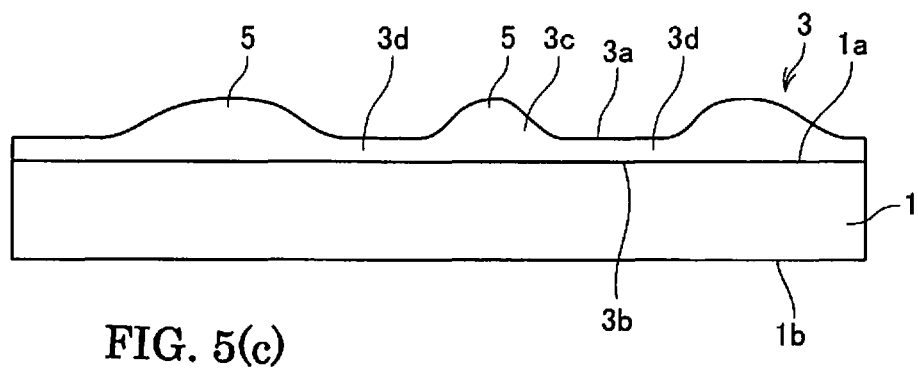
FIG. 5(c) shows the state that a plurality of raised parts 5 continuous with each other are provided on the base crystal layer 3.
Figure 5C:
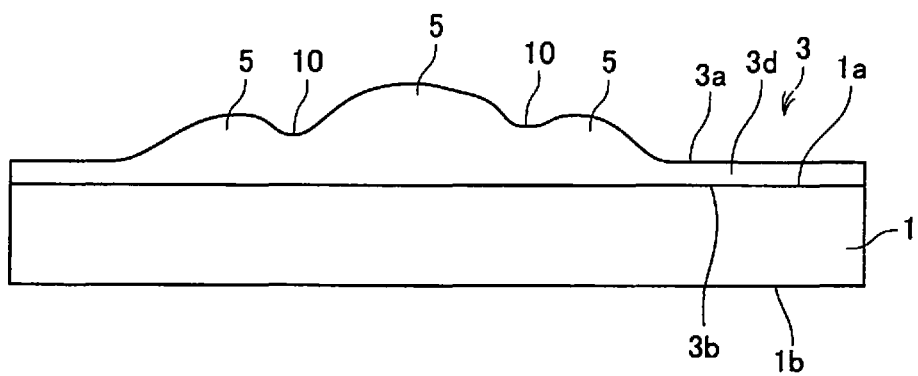

Further, as shown in FIG. 5(b), a flat part 3d may be provided between the raised parts 5. Alternatively, as shown in FIG. 5(c), the adjacent raised parts 5 may be made continuous without intervening the flat part. In this case, a recess 10 is generated between the adjacent raised parts 5.

Figure 6A:
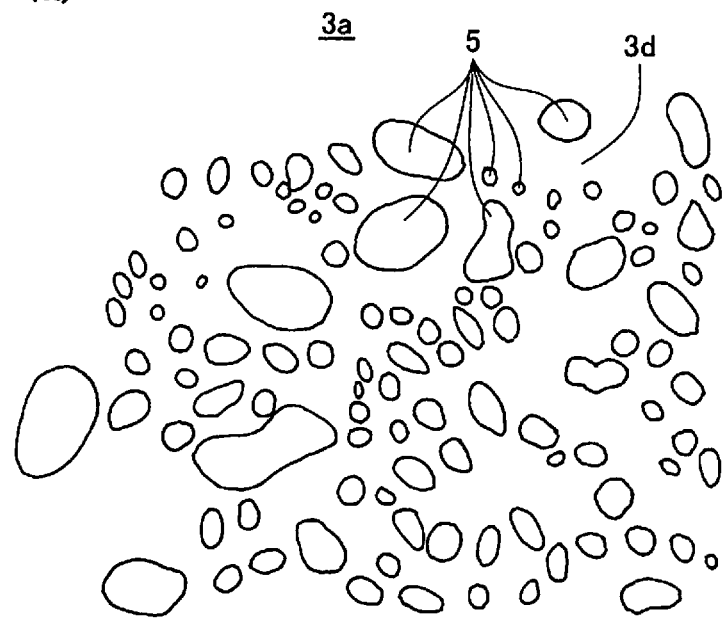
FIGS. 6(a) and 6(b) show planar patterns of base crystal layers 3, respectively.

The planar shape of the raised part is not particularly limited. For example, according to an example of FIG. 6(a), many island-shaped raised parts 5 are formed on the crystal growth surface 3a and the flat parts 3d are provided between the adjacent raised parts 5. Each of the raised parts forms a separate phase and the flat parts 3d form a network-like continuous phase.

Figure 6B:
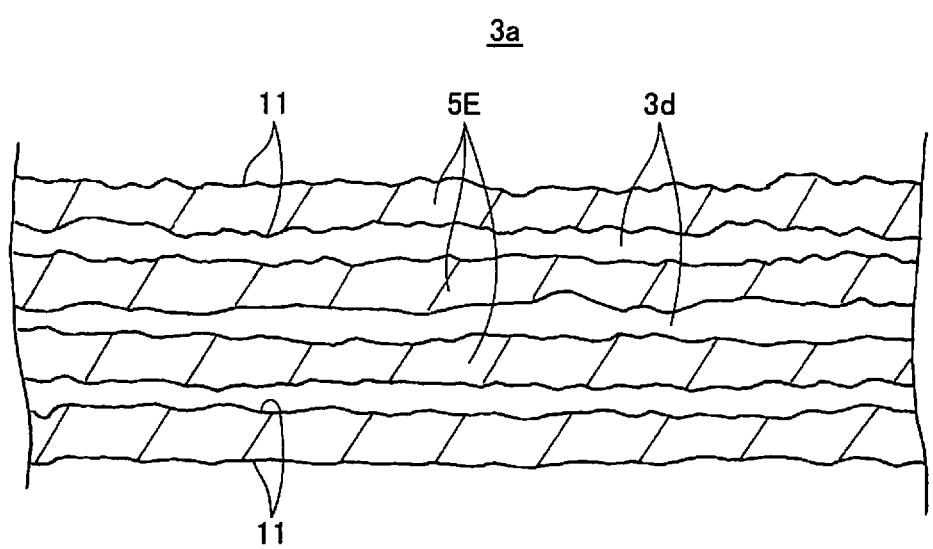

According an example of FIG. 6(b), raised parts 5E are patterned into stripe-shaped pattern. However, as the raised part 5E is enlarged, many raised parts may be made continuous as shown in FIG. 5(b). Thus, the edge 11 of the raised part 5E may form an irregular curved line and may not be straight line-shaped.

Figure 7A:
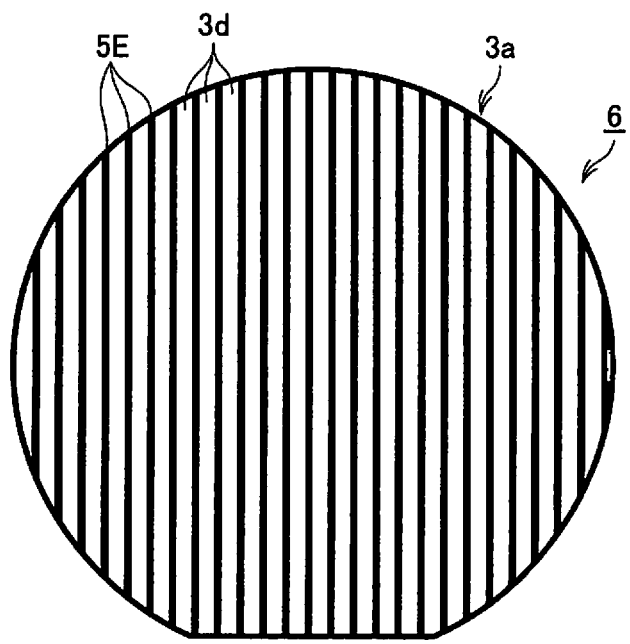
FIGS. 7(a) and 7(b) show planar patterns of raised parts of base crystal layers 3, respectively.
Figure 7B:
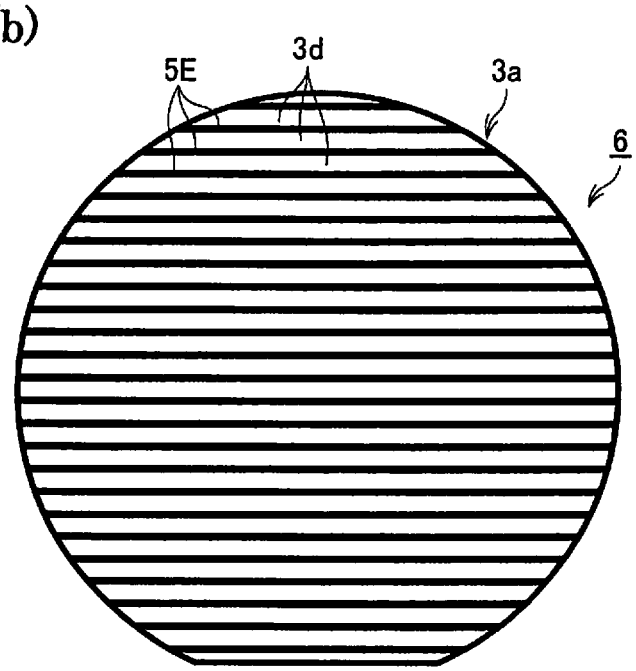
Figure 8A:
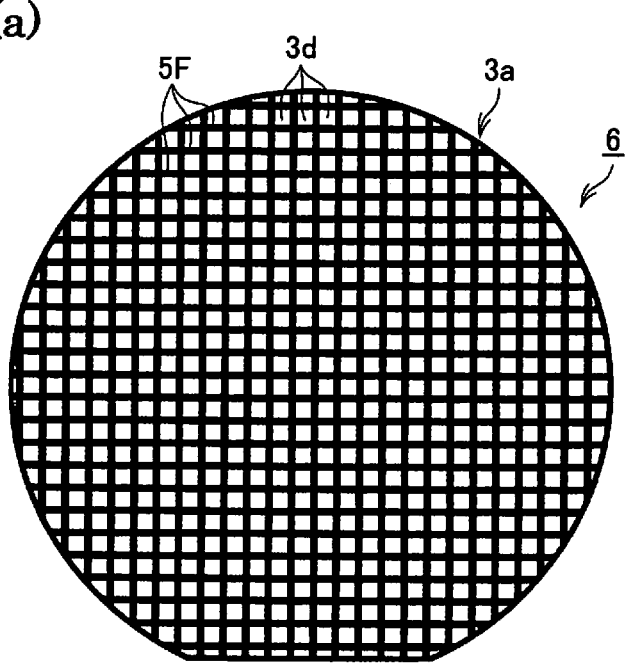
FIGS. 8(a) and 8(b) show planar patterns of raised parts of base crystal layers 3, respectively.
Figure 8B:
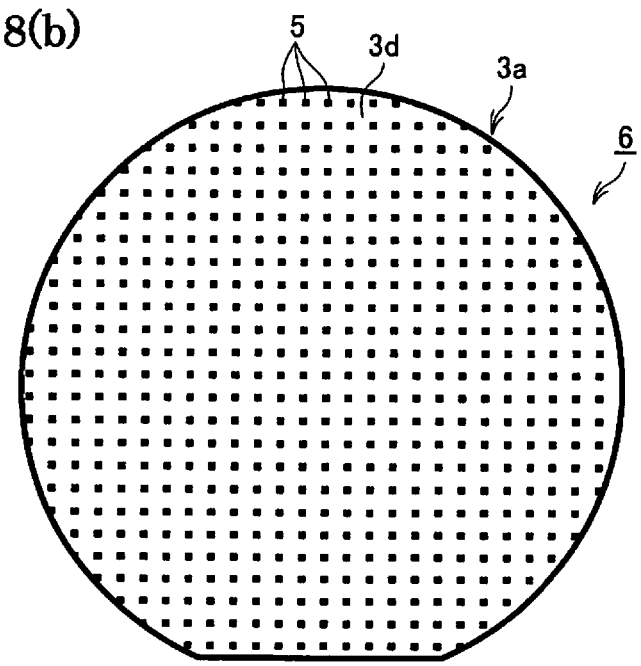

In the case of the patterning of the raised parts as a whole, the pattern of the raised parts is not particularly limited. According to the examples shown in FIGS. 7(a) and 7(b), many stripe-shaped raised parts 5E are arranged in lines. Further, according to an example of FIG. 8(a), network and lattice forming raised parts 5F are formed and, according to an example of FIG. 8(b), raised parts 5 are formed as dots or scattered points or islands.

Figure 9A:
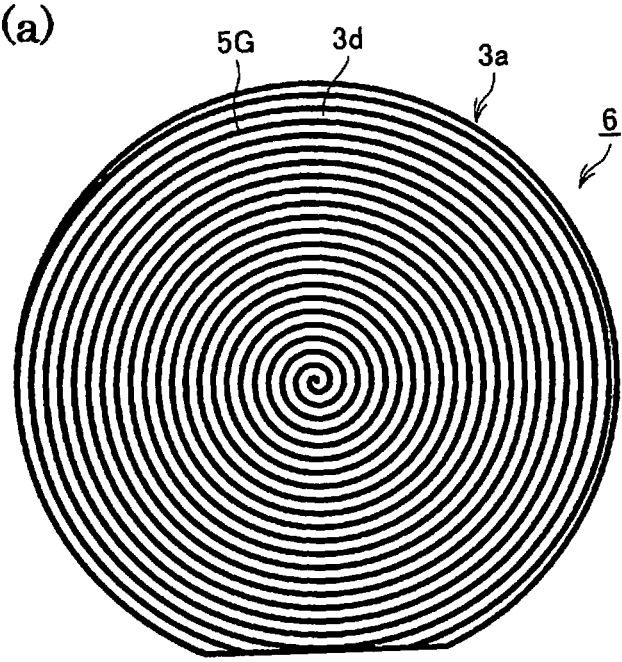
FIGS. 9(a) and 9(b) show planar patterns of raised parts of base crystal layers 3, respectively.
Figure 9B:
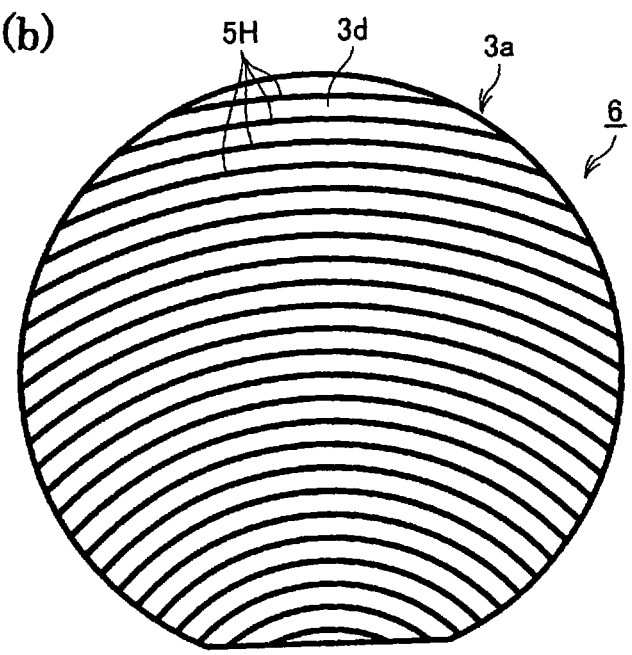

Further, according to the examples of FIGS. 9(a) and 9(b), raised parts 5G and 5H are formed in spiral shapes, respectively. Further, according to the example of FIG. 9(a), the center of the spiral is within the crystal growth surface and according to the example of FIG. 9(b), the center of the spiral is outside of the crystal growth surface.

The void means a space which is not filled with the materials of the supporting substrate and base crystal layer or the reaction product.

The area of the void (area in the cross section perpendicular to the main face of the supporting body) may preferably be 1 $\mu m^2$ to 0.8 $mm^2$. Further, the height of the void (dimension in the direction of the normal line P perpendicular to the main face) may preferably be 1000 nm or smaller and more preferably be 500 nm or smaller. Although the lower limit of the height is not particularly defined, it may be 1 nm or larger.

Further, the ratio of the area of the void of the base crystal layer with respect to the whole crystal growth surface may preferably be 5 to 80% from the viewpoint of the present invention and more preferably be 15 to 60% on the viewpoint of the productivity.

The presence and height of the void is measured by observing the cross section by an electron microscope. The conditions are as follows.

Measuring System:

Electron microscope ("SU8240" supplied by HITACHI High Technologies Co. Ltd.) is used to perform the observation of the microstructure.

Measurement Conditions:

A sample is produced by a FIB (focused ion beam) method to form the cross section, which is observed at an acceleration voltage of 3 kV.

The planar (two-dimensional) shape and area of the void is visualized by irradiating light from the bottom surface of the sample and by observing a transmittance image by a differential interference microscope.

According to a preferred embodiment, provided that the raised part 5 is viewed along the cross section perpendicular to the main face 1a of the supporting substrate 1 (refer to FIG. 1(b)), the angle θ of the specific crystal axis a of the crystal of the group 13 nitride with respect to the normal line P of the main face is smoothly changed. It is thus possible to further reduce the dislocation density of the layer of the crystal of the group 13 nitride formed thereon efficiently. The specific crystal axis may be the c-axis, m-axis or a-axis and more preferably be the c-axis.

Figure 2B:
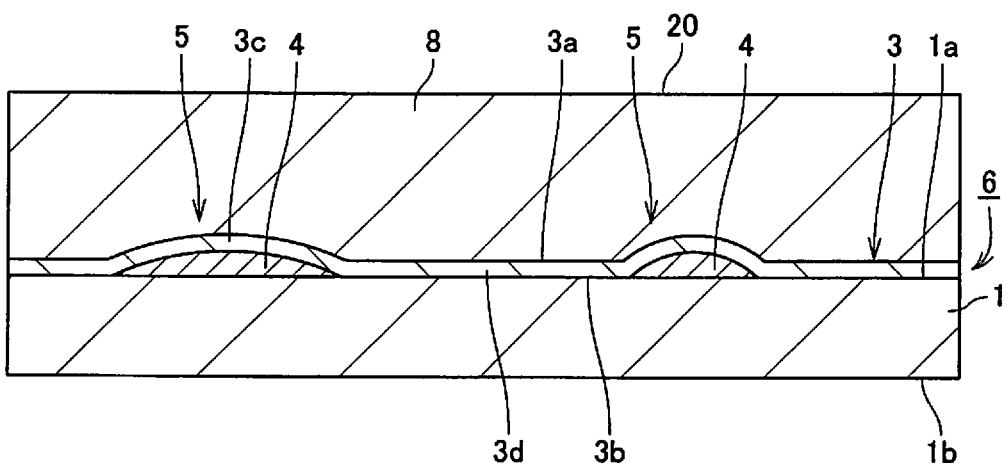

For example, as shown in FIG. 2(a), when the thin film of the layer 7 of the crystal of the group 13 nitride is formed on the base crystal layer, the dislocation density can be reduced. Further, as shown in FIG. 2(b), when the thin film of the layer 8 of the crystal of the group 13 nitride is formed on the base crystal layer as shown in FIG. 2(b), in addition to the reduction of the dislocation density of the layer of the crystal of the group 13 nitride, cracks can be suppressed and the warping of the layer of the crystal of the group 13 nitride can be also suppressed.

The wavelength of the laser light is made a wavelength whose energy is higher than a bandgap of the group 13 nitride forming the seed crystal layer to be processed and lower than a bandgap of the material of the supporting substrate. By this, at the time of irradiating the laser light from the side of the supporting substrate, the laser light passes through the supporting substrate and then is absorbed by the group 13 nitride forming the seed crystal layer to heat it to perform the processing.

The conversion of energy (unit: e V) and wavelength (unit: nm) can be calculated according to the approximate expression $$\lambda \approx 1240/E$$

provided that E is assigned to the energy and X is assigned to the wavelength.

For example, when the supporting substrate is made of aluminum oxide (for example, sapphire or crystalline orientated aluminum) and the nitride of the group 13 nitride forming the seed crystal layer is gallium nitride, as the bandgaps are about 3.4 eV and 8.6 eV, respectively, it is necessary that the wavelength of the laser light is selected in a range of 144 nm and 364 nm.

The source of the laser light includes third, fourth and fifth harmonic waves of a Nd YAG laser, F2 excimer laser, ArF excimer laser, KrF excimer laser, XeCl excimer laser, XeF excimer laser, third and fourth harmonic waves of a $YVO_4$ laser, and third and fourth harmonic waves of a YLF laser. A particularly preferred laser light source includes the third harmonic wave of a Nd YAG laser, fourth harmonic wave of a Nd:YAG laser, third and fourth harmonic waves of a $YVO_4$ laser and a KrF excimer laser.

The shape of the irradiated laser light beam may be a circle, ellipse, rectangle or line.

The laser profile may be shaped through a beam profiler. The laser profile may be gaussian, gaussian-like, donut, or silk hat. The beam profiles of gaussian and silk hat are preferred.

The laser light may be irradiated onto the substrate after it is passes through a lens, slit or aperture, for adjusting the irradiation size and energy density.

According to a preferred embodiment, a pulse laser may preferably be used to adjust the formation of the raised part. Although the pulse width of the laser light is not particularly limited, laser light having the pulse width of 100 fs to 200 ns may be used. A shorter pulse is preferable, since the shorter pulse laser light results in a shorter time period of heating the interface GaN, so that the heating and expansion of nitrogen generated from GaN decomposed by the irradiation of the laser light is reduced. From the viewpoint of controllability of the size of the raised part, the pulse width of the laser light may preferably be 200 ns or shorter and more preferably be ins or shorter.

The energy density of the laser light beam may preferably be 200 to 350 $mJ/cm^2$ and more preferably be 250 to 300 $mJ/cm^2$. As the energy density is too low, the crystal of the group 13 nitride at the interface is non-reactive and, as the energy density is too high, the GaN at the interface is decomposed into the group 13 element and nitrogen so that the generation of the appropriate raised part tends to be suppressed.

The irradiation of the pulse laser light may be performed so that pulses do not overlap with each other and, preferably, the laser scanning speed and repetition frequency are controlled so that the laser spots overlap with each other. The laser light beams, each having a weak energy, may be irradiated and overlapped so that the rapid evaporation of nitrogen due to the decomposition of the crystal of the group 13 nitride can be suppressed to make abnormal parts of the crystal of the group 13 nitride smaller.

The processing may be performed so that the focal point of the laser light is positioned at the interface of the base crystal layer and supporting substrate, or the laser light may be defocused and irradiated.

A diffuser may be placed on a bottom face of the supporting substrate and the laser light may be irradiated through the diffuser. The material of the diffuser is selected from materials through which the applied laser light transmits. An example of the diffuser includes a sapphire substrate whose surface is roughened only and a translucent ceramic plate. A diffuser having a surface on which regular or irregular unevenness is formed is further applicable.

The laser light may be irradiated onto the supporting substrate while it is heated. As the heating of the supporting substrate reduces the warping, it is possible to perform uniform processing over the plane of the substrate.

It is possible to suppress abnormal parts generated during the irradiation of the laser light from the side of the supporting substrate by forming a surface protective layer, such as a photo resist, metal deposition film or the like, on the base crystal layer.

The base crystal layer may be provided by bonding it with the supporting substrate. The method of bonding includes direct bonding or bonding by an adhesive agent. Further, in this case, the material of the supporting substrate may be silicon. In this case, it is possible to suppress abnormal parts generated during the irradiation of the laser light from the side of the supporting substrate.

The laser light may be scanned by patterning or over the whole surface of the supporting substrate and it is possible to obtain the effect of reducing the dislocation density over the whole of the substrate.

The planar pattern of the patterned raised parts may preferably be uniform over the whole plane in a plan view and the same kind of pattern may preferably be repeated regularly. Specifically, the pattern may be mesh-shaped, stripe-shaped, dot-shaped, spiral-shaped or the like (refer to FIGS. 7 to 9).

The voids are also formed at the interface due to the decomposition of the group 13 nitride caused by the laser irradiation. The voids in this mode are formed mainly inside of the base crystal layer than at the interface. However, when the voids are formed, the raised parts are not necessarily formed. The raised parts are not formed without the application of a stress sufficiently high for deforming the base crystal layer.

Then, the crystal of the group 13 nitride is grown on the base crystal layer. In this case, although it is preferred to grow the crystal of the group 13 nitride by a flux method, it may be an ammonothermal method, HVPE method, MOCVD method or MBE method. In the group 13 nitride, the group 13 element is a group 13 element defined by the Period Table defined by IUPAC. Further, the group 13 nitride may specifically and preferably be GaN, AlN, InN or the mixed crystals thereof.

From the viewpoint of making the crystal of the group 13 nitride self-standing after it is separated from the supporting substrate, the thickness of the crystal of the group 13 nitride may preferably be 300 µm or larger and, more preferably, be 500 µm or larger. Further, particularly for spontaneously separating the crystal of the group 13 nitride, the thickness may preferably be 1000 µm or larger.

The crystal of the group 13 nitride is preferably a single crystal. The definition of the single crystal will be described below. Although it includes a single crystal in conformity with the text-book definition in which, atoms are regularly arranged over the whole of the crystal, it is not necessarily limited to this definition and the single crystal includes a single crystal generally supplied in the industry. That is, the crystal may contain some degree of defects, incorporate deformation and contain impurities, and these crystals are referred to and utilized as a single crystal distinguishable from a polycrystal (ceramic) and incorporated herein.

When the crystal of the group 13 nitride is grown by a flux method, the kind of flux is not particularly limited, as long as the group 13 nitride can be generated. According to a preferred embodiment, a flux containing at least one of an alkali metal and alkali earth metal is used, and the flux containing sodium metal is particularly preferred.

A raw material of a metal is mixed with the flux and used. As the raw material of the metal, a simple metal, an alloy or a metal compound may be used, and a simple metal is preferred from the viewpoint of handling.

The growth temperature and holding time of the growth of the crystal of the group 13 nitride by the flux method are not particularly limited and appropriately changed depending on the composition of the flux. According to an example, when a sodium- or lithium-containing flux is used to grow the group 13 nitride, the growth temperature may preferably be 800 to 950° C. and more preferably be 850 to 900° C.

According to the flux method, the crystal of the group 13 nitride is grown under an atmosphere containing gases including a nitrogen atom. Although the gas may preferably be nitrogen gas, it may be ammonia. Although the pressure of the atmosphere is not particularly limited, the pressure may preferably be 10 atm or higher and more preferably be 30 atm or higher from the viewpoint of preventing the evaporation of the flux. However, if the pressure is too high, the system becomes bulky, so that the total pressure of the atmosphere may preferably be 2000 atm or lower and more preferably be 500 atm or lower. Although a gas other than the gas containing a nitrogen atom in the atmosphere is not limited, an inert gas is preferred, and argon, helium and neon are particularly preferred.

According to a preferred embodiment, the crystal of the group 13 nitride is separated from the supporting substrate. According to the present invention, the ratio of the area of the raised part in the supporting substrate surface is controlled so that the grown crystal of the group 13 nitride can be peeled by spontaneously separation or other methods. The spontaneous separation method is advantageous since the number of steps can be reduced. On the other hand, when the crystal of the group 13 nitride is separated by processing without the spontaneous separation, it is possible to control the conditions for the separation artificially, so that the yield can be further improved and the reduction of the yield is low even when the size of the substrate is made larger.

Laser lift-off (LLO) and grinding are preferred for separating the crystal of the group 13 nitride from the supporting substrate by processing. When the crystal of the group 13 nitride is generated from the supporting substrate by the processing, the yield is improved compared with the case that the interfacial reaction product layer, metal of the group 13 element or void is not present. The reason is because as the thickness of the supporting substrate is made smaller, for example, by the grinding, the supporting substrate is spontaneously separated from the starting point inside of the interfacial reaction product layer, metal of the group 13 nitride or void. Contrary to this, when the interfacial reaction product layer, metal of the group 13 element or void is not present, as the thickness of the supporting substrate is thinned by the grinding, a large stress is applied on the crystal of the group 13 nitride so that the generation of cracks in the crystal is facilitated.

A functional device structure is formed on the thus obtained crystal of the group 13 nitride. The functional device structure may be used for a white LED of a high luminance and high rendering index, a blue-violet laser disk for a high speed and high-density optical memory, a power device for an inverter for a hybrid automobile, or the like.

EXAMPLES

Inventive Example A1

According to the Inventive Example A1, a structure (1) shown in FIG. 2(a) (refer to Table 1) was obtained according to the method shown in FIG. 1.

Specifically, a monocrystalline sapphire c-plane substrate 1 having a diameter of 4 inches and thickness of 1.3 mm was contained in a MOCVD (organic metal vapor phase deposition) equipment and heated in hydrogen atmosphere at 1150° C. for 10 minutes to perform the cleaning of the surface. The temperature of the substrate was then lowered to 500° C. and TMG (trimethyl gallium) and ammonia were used as raw materials to grow a gallium nitride layer in a thickness of 20 nm to form the base crystal layer. The temperature of the substrate was raised to 1100° C. and TMG and ammonia were used as raw materials to grow the base crystal layer 2 composed of gallium nitride in a thickness of 5 μm.

Laser light was then irradiated from the side of the bottom surface 1b of the supporting substrate 1 to form the raised parts. The bottom surface 1b was subjected to finishing by grinding so that the surface roughness Ra was made 0.1 to 0.3 μm.

A pulse laser applying a third harmonic wave (having a wavelength of 355 nm) of $YVO_4$ laser was used as a laser light source. The output power was 10 W, the repetition frequency was 100 kHz, the pulse width was 20 ns and the light was condensed by a lens having a focal distance of 200 mm. The working distance (a distance between the lens and sample) was 150 mm. A galvano scanner was used to raster-scan the laser light while the shot pitch and line spacing of the laser irradiation were changed to obtain the base crystal layers, each having the void, reaction product and raised part shown in Table 1.

The base substrate was then subjected to cleaning by acetone for 10 minutes and to ultrasonic cleaning using isopropyl alcohol for 10 minutes, followed by cleaning with flowing pure water for 10 minutes.

The gallium nitride crystal 8 was then grown on each of the base crystal layers by the Na flux method.

The base substrate was then mounted on a bottom part of an alumina crucible having a cylindrical shape and flat bottom with a diameter of 190 mm and a height of 45 mm and the resulting melt composition was then filled in the crucible in a glove box. The melt composition had a composition as follows.

Ga metal: 200 g
Na metal: 200 g

The alumina crucible was then contained and sealed in a container of a heat-resistant metal, which was then mounted on a rotatable table in a crystal growth furnace. The temperature and pressure were raised to 870° C. and 4.0 MPa under a nitrogen atmosphere and the resulting solution was agitated by rotation to grow gallium nitride crystal for about 4 hours. After the completion of the crystal growth, it was gradually cooled to room temperature over 3 hours and the growth container was then taken out of the crystal growth furnace. Ethanol was used to remove the melt composition remaining in the crucible and it was collected a sample with the grown gallium nitride crystal. It was proved that a gallium nitride crystal 8 was film-formed in a thickness of 80 μm in each sample.

The sample was then subjected to polishing so that the thickness of the GaN film by a flux method was made 10 μm. Thereafter, the surface was observed by a differential interference microscope to prove that pits or disassociation of the crystal was not observed. Further, the X-ray rocking curve was measured to prove that the half value widths were 120 seconds and 150 seconds at reflections at the (0002) plane and (10-12) plane, respectively, indicating that the c-axis was not substantially deviated.

The dislocation density, warping and cracking of the gallium nitride crystal layer were then measured and the results are shown in Table 1.

Comparative Example A1

The structure (1) was obtained according to the same procedure as the Inventive Example A1. However, different from the Inventive Example A1, the irradiation of the laser light was not performed and the raised part was not formed. The dislocation density, warping and cracking of the thus obtained gallium nitride crystal layer were measured and the results are shown in Table 1.

TABLE 1

| | | Unit | Inventive Example A1 | Comparative Example A1 |
|---|---|---|---|---|
| Sample structure | | | (1) | (1) |
| Lasing conditions | Shot pitch | μm | 20 | — |
| | Line spacing | μm | 50 | — |
| Base substrate | Presence or absence of reaction product | | present | absent |
| | Presence or absence of void | | present | absent |
| | Average height of raised parts | nm | 200 | 0 |
| | Ratio of area of raised parts | % | 30 | 0 |
| Characteristic of GaN substrate | Dislocation Density | $cm^{-2}$ | $2 \times 10^7$ | $8 \times 10^7$ |
| | Warping | μm | 10 | 35 |
| | Crack | | absent | absent |

Inventive Example B1

The structure (2) shown in FIG. 2(b) was obtained (refer to Table 2).

Further, the base substrate was produced according to the same procedure as the Inventive Example A1, except that the height and dimension of the raised part and the presence and absence of the void and reaction product were changed as shown in Table 2.

The gallium nitride crystal 8 was then grown on each of the base crystal layers by the Na flux method.

The base substrate was then mounted on a bottom part of an alumina crucible having a cylindrical shape and a flat bottom with a diameter of 190 mm and a height of 45 mm, and the melt composition was then filled in the crucible in a glove box. The melt composition had a composition was as follows.

Ga metal: 200 g
Na metal: 200 g

After the alumina crucible was contained and sealed in a container of a heat-resistant metal container, the container was then mounted on a rotatable table in a crystal growth furnace. The temperature and pressure were raised to 870° C. and 4.0 MPa under a nitrogen atmosphere and the resulting solution was agitated by rotation to grow a gallium nitride crystal for about 50 hours. After the completion of the crystal growth, it was gradually cooled to room temperature over 3 hours and the growth container was then taken out of the crystal growth furnace. Ethanol was used to remove the melt composition remaining in the crucible and a sample with the grown gallium nitride crystal was collected. It was proved that gallium nitride crystal 8 was film-formed in a thickness of 1 mm in each sample.

The gallium nitride crystal was then separated from the supporting substrate by the laser lift-off method in each of the examples. Laser light was then irradiated from the side of the sapphire substrate. A pulse laser applying a third harmonic wave (having a wavelength of 355 nm) of Nd:YAG laser was used as a laser light source. The pulse width was 10 ns, the light was condensed by a lens having a focal distance of 700 mm, the distance between the lens and the substrate surface was 400 mm, the optical energy density during the laser lift-off was 500 mJ/cm$^2$, and the whole substrate was scanned so that irradiation dots by the pulse laser were overlapped.

The sample was then subjected to polishing so that the total thickness was made 400 μm. Thereafter, the surface was observed by a differential interference microscope to prove that pits or disassociation of the crystal was not observed. Further, the X-ray rocking curve was measured to prove that the half value widths were 70 seconds and 80 seconds at reflections at the (0002) plane and (10-12) plane, respectively, indicating that the c-axis was not substantially deviated.

The dislocation density, warping and cracking of the thus obtained gallium nitride layer were measured in each of the examples, and the results were shown in Table 2.

Comparative Example B1

The structure (2) was obtained according to the same procedure as the Inventive Example B1. However, different from the Inventive Example A1, the irradiation of the laser light was not performed and the raised part was not formed. The dislocation density, warping and cracking of the thus obtained gallium nitride crystal layer were measured and the results are shown in Table 2.

TABLE 2

|  |  | Unit | Inventive Example B1 | Comparative Example B1 |
|---|---|---|---|---|
| Sample structure |  |  | (2) | (2) |
| Lasing conditions | Shot pitch | μm | 20 | — |
|  | Line spacing | μm | 50 | — |
| Base substrate | Presence or absence of reaction product |  | present | Absent |
|  | Presence or absence of void |  | Present | absent |
|  | Average height of raised parts | nm | 200 | 0 |
|  | Ratio of area of raised parts | % | 30 | 0 |
| Characteristic of GaN substrate | Dislocation Density | cm$^{-2}$ | $5 \times 10^4$ | $7 \times 10^6$ |
|  | Warping | μm | 80 | 120 |
|  | Crack |  | absent | present |

Inventive Examples C1 to C4

The structure (2) was obtained according to the same procedure as the Inventive Example B1. However, different from the Inventive Example B1, the average height of the raised parts was changed as shown in Table 3. The dislocation density, warping and cracking of the thus obtained gallium nitride crystal layer were measured and the results are shown in Table 3.

TABLE 3

|  |  | Unit | Inventive Example C1 | Inventive Example C2 | Inventive Example C3 | Inventive Example C4 |
|---|---|---|---|---|---|---|
| Sample structure |  |  | (2) | (2) | (2) | (2) |
| Lasing conditions | Shot pitch | μm | 100 | 50 | 20 | 1 |
|  | Line spacing | μm | 50 | 50 | 50 | 50 |
| Base substrate | Presence or absence of reaction product |  | Present | Present | Present | Present |
|  | Presence or absence of void |  | Absent | Absent | Present | Present |
|  | Average height of raised parts | nm | 5 | 50 | 200 | 500 |
|  | Ratio of area of raised parts | % | 30 | 30 | 30 | 30 |
| Characteristic of GaN substrate | Dislocation Density | cm$^{-2}$ | $6 \times 10^5$ | $8 \times 10^4$ | $5 \times 10^4$ | $4 \times 10^4$ |
|  | Warping | μm | 120 | 90 | 80 | 40 |
|  | Crack |  | Absent | Absent | Absent | Absent |

Inventive Examples D1 to D5

The structure (2) was obtained according to the same procedure as the Inventive Example B1. However, different from the Inventive Example B1, the ratios of the areas of the raised parts were changed as shown in Table 4. The dislocation density, warping and crack of the thus obtained gallium nitride crystal layer were measured and the results are shown in Table 4.

Comparative Example E1

The structure was obtained according to the same procedure as the Inventive Example E1.

However, different from the Inventive Example E1, the irradiation of the laser light was not performed and the raised part was not formed. The dislocation density, warping and cracking of the thus obtained gallium nitride crystal layer were measured and the results are shown in Table 5.

TABLE 4

|  |  | Unit | Inventive Example D1 | Inventive Example D2 | Inventive Example D3 | Inventive Example D4 | Inventive Example D5 |
|---|---|---|---|---|---|---|---|
| Sample structure |  |  | (2) | (2) | (2) | (2) | (2) |
| Lasing conditions | Shot pitch | μm | 20 | 20 | 20 | 20 | 20 |
|  | Line spacing | μm | 100 | 50 | 25 | 10 | 5 |
| Base substrate | Presence or absence of reaction product |  | Present | Present | Present | Present | Present |
|  | Presence or absence of void |  | Present | Present | Present | Present | Present |
|  | Average height of raised parts | nm | 200 | 200 | 200 | 200 | 200 |
|  | Ratio of area of raised parts | % | 10 | 30 | 50 | 70 | 85 |
| Characteristic of GaN substrate | Dislocation Density | $cm^{-2}$ | $3 \times 10^5$ | $5 \times 10^4$ | $3 \times 10^4$ | $1 \times 10^4$ | $1 \times 10^4$ |
|  | Warping | μm | 110 | 80 | 50 | 40 | 40 |
|  | Crack |  | Absent | Absent | Absent | Absent | Absent |

Inventive Example E1

The structure (3) (refer to Table 5) was obtained according to the same procedure as the Inventive Example B1.

However, different from the Inventive Example B1, the gallium nitride layer was film-formed by HVPE method.

Specifically, the base substrate was contained in an HVPE equipment, and gallium metal (Ga) in a source boat heated at 800° C. was reacted with hydrogen chloride (HCl) gas to generate gallium chloride (GaCl) gas, and the gallium chloride gas and ammonia ($NH_3$) as raw materials and hydrogen ($H_2$) gas as a carrier gas were supplied onto the main surface of the heated seed crystal substrate so that the gallium nitride crystal was grown on the substrate. The temperature was raised at 1100° C. and the gallium nitride crystal was grown for 5 hours, resulting in the film-formation of the gallium nitride crystal 8 having a thickness of 1 mm.

After the growth of the gallium nitride crystal layer, as the layer was subjected to polishing and the surface was observed by a differential interference microscope, pits and disassociation of the crystals were not observed. Further, the X-ray rocking curve was measured to prove that the half value widths were 80 seconds and 90 seconds at reflections at the (0002) plane and (10-12) plane, respectively, indicating that the c-axis was not substantially deviated.

The gallium nitride layer was separated from the supporting substrate according to the same procedure as the Inventive Example B1 and the dislocation density, warping and cracking were measured. The results are shown in Table 5.

TABLE 5

|  |  | Unit | Inventive Example E1 | Comparative Example E1 |
|---|---|---|---|---|
| Sample structure |  |  | (3) | (3) |
| Lasing conditions | Shot pitch | μm | 20 | — |
|  | Line spacing | μm | 50 | — |
| Base substrate | Presence or absence of reaction product |  | present | absent |
|  | Presence or absence of void |  | present | absent |
|  | Average height of raised parts | nm | 200 | 0 |
|  | Ratio of area of raised parts | % | 30 | 0 |
| Characteristic of GaN substrate | Dislocation Density | $cm^{-2}$ | $6 \times 10^4$ | $7 \times 10^6$ |
|  | Warping | μm | 90 | 120 |
|  | Crack |  | absent | present |

Inventive Examples F1 to F3 and Comparative Examples F1 to F3

The structure (2) was obtained according to the same procedure as the Inventive Example B1. However, different from the Inventive Example B1, the laser output power was changed so that the energy density of the pulse laser irradiated from the side of the supporting substrate was made each value shown in Tables 6 and 7. The shot pitch and line spacing of the laser irradiation were 20 μm and 50 μm, respectively.

The reaction product, void, gallium metal and raised part of the thus obtained base substrate were measured, respectively. Further, the dislocation density, warping and cracking of the thus obtained gallium nitride crystal layer were measured. The results are shown in Tables 6 and 7.

TABLE 6

|  |  | Inventive Example F1 | Inventive Example F2 | Inventive Example F3 |
|---|---|---|---|---|
| Energy density (mJcm$^{-2}$) |  | 350 | 300 | 250 |
| Thickness of rection product (nm) |  | 150 | 100 | 50 |
| Composition of reaction product | Al (mol %) | 29 | 37 | 42 |
|  | Ga (mol %) | 40 | 25 | 10 |
|  | O (mol %) | 31 | 38 | 48 |
| Presence or absence of gallium metal |  | present | present | absent |
| Presence or absence of void |  | present | present | absent |
| Presence or absence of raised part (height (nm)) |  | 300 | 200 | 100 |
| Dislocation density of gallium nitride substrate |  | 4 × 10$^4$ | 5 × 10$^4$ | 7 × 10$^5$ |
| Warping (μm) |  | 50 | 70 | 80 |
| Crack |  | absent | absent | Absent |

TABLE 7

|  |  | Comparative Example F1 | Comparative Example F2 | Comparative Example F3 |
|---|---|---|---|---|
| Energy density (mJcm$^{-2}$) |  | 120 | 60 | Not irradiated |
| Thickness of rection product (nm) |  | absent | absent | absent |
| Composition of reaction product | Al (mol %) | — | — | — |
|  | Ga (mol %) | — | — | — |
|  | O (mol %) | — | — | — |
| Presence or absence of void |  | absent | absent | absent |
| Presence or absence of raised part (height (nm)) |  | absent | absent | absent |
| Dislocation density of gallium nitride substrate |  | 5 × 10$^6$ | 6 × 10$^6$ | 7 × 10$^6$ |
| Warping (μm) |  | 690 | 320 | 450 |
| Crack |  | absent | present | present |

As can be seen from the above, according to the inventive examples, the warping of the gallium nitride layer was small and cracks were not observed. Further, when the reaction product was generated under the base crystal layer, the dislocation density of the gallium nitride layer was considerably reduced.

According to the Comparative Examples F1, F2 and F3, as the reaction product was not generated, the warping of gallium nitride crystal was large and cracks were generated.

The invention claimed is:

1. A base substrate comprising:
   a supporting substrate; and
   a base crystal layer provided on a main face of said supporting substrate, comprising a crystal of a nitride of a group 13 element and having a crystal growth surface,
   wherein said base crystal layer comprises a raised part;
   a reaction product of a material of said supporting substrate and said crystal of said nitride of said group 13 element, a metal of a group 13 element and/or a void is present between said raised part and said supporting substrate; and
   said crystal growth surface forms a curved line and a height of said crystal growth surface on said curved line with respect to said main face is smoothly changed, provided that said raised part is viewed along a cross section perpendicular to said main face of said supporting substrate.

2. The base substrate of claim 1, wherein an angle of a specific crystal axis of said crystal of said nitride of said group 13 element with respect to a normal line to said main face is smoothly changed, provided that said raised part is viewed along said cross section perpendicular to said main face of said supporting substrate.

3. The base substrate of claim 2, wherein said specific crystal axis comprises c-axis.

4. The base substrate of claim 1,
   wherein said supporting substrate comprises aluminum oxide, and
   said reaction product comprises aluminum, a group 13 element and oxygen.

5. The base substrate of claim 1, wherein said raised part comprises a crack or recess formed therein.

6. The base substrate of claim 1, wherein said reaction product is present between said raised part and said supporting substrate.

7. The base substrate of claim 1, wherein said metal of said group 13 element is present between said raised part and said supporting substrate.

8. The base substrate of claim 1, wherein said void is present between said raised part and said supporting substrate.

9. A functional device comprising:
   said base substrate of claim 1; and
   a functional layer provided on said base crystal layer.

10. A base substrate comprising:
    a supporting substrate; and
    a base crystal layer provided on a main face of said supporting substrate, comprising a crystal of a nitride of a group 13 element and having a crystal growth surface,
    wherein said base crystal layer comprises a raised part;
    said crystal growth surface forms a curved line; and
    a height of said crystal growth surface on said curved line with respect to said main face is smoothly changed, provided that said raised part is viewed along a cross section perpendicular to said main face of said supporting substrate.

11. The base substrate of claim 10, wherein an angle of a specific crystal axis of said crystal of said nitride of said group 13 element with respect to a normal line to said main face is smoothly changed, provided that said raised part is viewed along said cross section perpendicular to said main face of said supporting substrate.

12. The base substrate of claim 11, wherein said specific crystal axis comprises c-axis.

13. The base substrate of claim 10, wherein a void is present between said base crystal layer and said supporting substrate.

14. The base substrate of claim 10, wherein a reaction product of a material of said supporting substrate and said crystal of said nitride of said group 13 element is present between said base crystal layer and said supporting substrate.

15. The base substrate of claim 14,
wherein said supporting substrate comprises aluminum oxide, and
said reaction product comprises aluminum, a group 13 element and oxygen.

16. The base substrate of claim 10, wherein a metal of a group 13 element is present between said raised part and said supporting substrate.

17. The base substrate of claim 10, wherein said raised part comprises a crack or recess formed therein.

18. A functional device comprising:
said base substrate of claim 10; and
a functional layer provided on said base crystal layer.

* * * * *